(12) United States Patent
Van Helvoort et al.

(10) Patent No.: US 10,481,228 B2
(45) Date of Patent: Nov. 19, 2019

(54) LIGHT DATA COMMUNICATION LINK DEVICE FOR USE IN MAGNETIC RESONANCE EXAMINATION SYSTEMS

(71) Applicant: KONINKLIJKE PHILIPS N.V., Eindhoven (NL)

(72) Inventors: Marinus Johannes Adrianus Maria Van Helvoort, Eindhoven (NL); Johan Samuel Van Den Brink, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 89 days.

(21) Appl. No.: 15/528,249

(22) PCT Filed: Nov. 25, 2015

(86) PCT No.: PCT/EP2015/077578
§ 371 (c)(1),
(2) Date: May 19, 2017

(87) PCT Pub. No.: WO2016/087272
PCT Pub. Date: Jun. 9, 2016

(65) Prior Publication Data
US 2017/0322268 A1 Nov. 9, 2017

(30) Foreign Application Priority Data
Dec. 4, 2014 (EP) ..................................... 14196303

(51) Int. Cl.
*G01V 3/00* (2006.01)
*G01R 33/36* (2006.01)
(Continued)

(52) U.S. Cl.
CPC ..... *G01R 33/3692* (2013.01); *G01R 33/3415* (2013.01); *G01R 33/385* (2013.01); *H04B 10/2503* (2013.01); *G01R 33/3657* (2013.01)

(58) Field of Classification Search
CPC ............. G01R 33/3692; G01R 33/283; G01R 33/285; G01R 33/34084; G01R 33/3415; G01R 33/28; G01R 33/3621
(Continued)

(56) References Cited

U.S. PATENT DOCUMENTS 5,602,668 A * 2/1997 Kuchta .............. H04B 10/1141
398/141
6,961,604 B1 11/2005 Vahasalo et al.
(Continued)

FOREIGN PATENT DOCUMENTS

CN 103654778 A 3/2014
DE 102007056223 A1 5/2009
(Continued)

*Primary Examiner* — Rodney E Fuller

(57) ABSTRACT

A light data communication link device (50) for use in a magnetic resonance examination system (10) comprises a first light emitter and receiver unit (52) and a second light emitter and receiver unit (76). A light generating member (54), a first optical waveguide (62) and a light diffuser (58) of the first light emitter and receiver unit (52), a distance in space between the light diffuser (58) and a converging lens (84) of the second light emitter and receiver unit (76), and the converging lens (84), a second optical waveguide (88) and a light receiving member (80) of the second light emitter and receiver unit (76) form a first optical pathway (90) for data communication. A light generating member (78), a first optical waveguide (86) and a light diffuser (82) of the second light emitter and receiver unit (76), a distance in space between the light diffuser (82) and a converging lens (60) of the first light emitter and receiver unit (52), and a converging lens (60), a second optical waveguide (64) and a light (Continued)

receiving member (56) of the first light emitter and receiver unit (52) form a second optical pathway (92) for data communication. At least the light generating member (54) of the first light emitter and receiver unit (52) is configured to be arranged outside a volume defined by the scanning unit (12). The second light emitter and receiver unit (76) is configured to be at least partially arranged inside the volume (30); and a magnetic resonance examination system (10) comprising such light data communication link device (50) for establishing a bi-directional data communication link between a control unit (26) of the magnetic resonance examination system (10) and at least one auxiliary electronic device (40) being arranged inside the volume (30).

20 Claims, 4 Drawing Sheets

(51) Int. Cl.
  G01R 33/3415 (2006.01)
  G01R 33/385 (2006.01)
  H04B 10/25 (2013.01)

(58) Field of Classification Search
  USPC .......................................................... 324/322
  See application file for complete search history.

(56) References Cited

U.S. PATENT DOCUMENTS

| 7,173,426 | B1* | 2/2007 | Bulumulla | G01R 33/3415 |
| | | | | 324/318 |
| 7,999,546 | B2 | 8/2011 | Trowell et al. | |
| 8,121,667 | B2* | 2/2012 | Fisher | G06F 1/163 |
| | | | | 600/300 |
| 9,504,429 | B1* | 11/2016 | Minkoff | G01R 33/5673 |
| 2004/0019273 | A1 | 1/2004 | Helfer et al. | |
| 2005/0107681 | A1* | 5/2005 | Griffiths | A61B 5/0046 |
| | | | | 600/410 |
| 2007/0182409 | A1* | 8/2007 | Varjo | G01R 33/3415 |
| | | | | 324/304 |
| 2007/0285021 | A1* | 12/2007 | Jauster | G01R 33/28 |
| | | | | 315/85 |
| 2010/0059679 | A1* | 3/2010 | Albrecht | A61B 5/0555 |
| | | | | 250/338.1 |
| 2016/0021219 | A1* | 1/2016 | Brown | A61B 6/541 |
| | | | | 370/216 |
| 2016/0077175 | A1* | 3/2016 | Mori | G01R 33/3692 |
| | | | | 324/321 |
| 2018/0259601 | A1* | 9/2018 | O'Neill | G01R 33/288 |

FOREIGN PATENT DOCUMENTS

| DE | 102010028901 A1 | 11/2011 |
| JP | 0556950 A | 3/1993 |
| WO | 2009144639 A2 | 12/2009 |
| WO | 2011159018 A2 | 12/2011 |
| WO | 2014024114 A1 | 2/2014 |

* cited by examiner

LIGHT DATA COMMUNICATION LINK DEVICE FOR USE IN MAGNETIC RESONANCE EXAMINATION SYSTEMS

CROSS REFERENCE TO RELATED APPLICATIONS

This application is a U.S. national phase application of International Application No. PCT/EP2015/077578, filed on Nov. 25, 2015, which claims the benefit of EP provisional Application Serial No. 14196303.3 filed on Dec. 4, 2014 and is incorporated herein by reference.

FIELD OF THE INVENTION

The invention pertains to a light data communication link device for use in a magnetic resonance examination system, a magnetic resonance examination system comprising such data communication link device and a method of using such light data communication link device in a magnetic resonance examination system.

BACKGROUND OF THE INVENTION

In the art of magnetic resonance examination, the susceptibility of magnetic resonance signals intended to be acquired to electromagnetic interference, which may be caused by operation of electronic devices in the vicinity of the magnetic resonance examination system, is known to be a constant challenge.

In an effort to reduce potential radio frequency interference it has been proposed to partially replace electronic devices by optical devices, particularly for data acquisition.

By way of example, international application WO 2006/008665 describes a magnetic resonance imaging system including a local coil assembly which is disposed in an examination region electrically isolated from the scanner. The coil assembly includes a plurality of coils each with an electronics module. The received resonance signals that are digitized by an analog-to-digital converter clocked by timing signals received optically from a scan controller. The digital resonance signals are converted into optical signals. The optical signals from each of the plurality of coil modules are communicated to a corresponding optical receiver/transmitter located on the scanner which converts the optical signals to electrical signals for transmission to a reconstruction processor, and the electrical signals from the scan controller to optical control and timing signals for transmission to the corresponding coil module.

SUMMARY OF THE INVENTION

It is desirable to further reduce the generation of potentially interfering radio frequency signals during the data acquisition and control of magnetic resonance examination systems.

It is therefore an object of the invention to provide a data communication link device for use in a magnetic resonance examination system with a reduced generation of radio frequency signals.

In one aspect of the present invention, the object is achieved by a light data communication link device for use in a magnetic resonance examination system including a scanning unit that comprises an enclosure having an outer enclosure surface that is defined by maximum spatial dimensions of the scanning unit.

The light data communication link device comprises a first light emitter and receiver unit and a second light emitter and receiver unit. Each light emitter and receiver unit includes
 a light generating member that is configured to generate light depending on an electrical signal applied to an electrical input port of the light generating member,
 a light receiving member that is configured to generate an electrical signal at an electrical output port as a function of received light,
 a light diffuser, and
 a converging lens.

In each light emitter and receiver unit, the light generating member is optically connected to the light diffuser by a first optical waveguide, and the light receiving member is optically connected to the converging lens by a second optical waveguide of the respective light emitter and receiver unit.

The light generating member, the first optical waveguide and the light diffuser of the first light emitter and receiver unit, a distance in space between the light diffuser of the first light emitter and receiver unit and the converging lens of the second light emitter and receiver unit, and the converging lens, the second optical waveguide and the light receiving member of the second light emitter and receiver unit form a first optical pathway for data communication.

The light generating member, the first optical waveguide and the light diffuser of the second light emitter and receiver unit, a distance in space between the light diffuser of the second light emitter and receiver unit and the converging lens of the first light emitter and receiver unit, and the converging lens, the second optical waveguide and the light receiving member of the first light emitter and receiver unit form a second optical pathway for data communication.

The phrase "light", as used in this application, shall be understood particularly as electromagnetic radiation in the range encompassing the optical regime of electromagnetic waves visible to human beings, as well as the regime of infrared radiation (Near Infrared (NIR), Mid Infrared (MIR) and Far Infrared (FIR)) and the regime of ultraviolet radiation (UV). The light receiving member is understood to be adapted to sense the electromagnetic radiation that is provided at the location of the light receiving member along the optical pathway.

At least the light generating member of the first light emitter and receiver unit is configured to be arranged outside a volume having an outer boundary surface comprising the outer enclosure surface. The second light emitter and receiver unit is configured to be at least partially arranged inside the volume.

One advantage of the invention lies in that a bi-directional light data communication link can be provided, although the light generating member of the first light emitter and receiver unit can be arranged at a location that is remote from the scanning unit of the magnetic resonance examination system. By that, a level of potentially interfering radio frequency signals generated by the light generating member of the first light emitter and receiver unit can at least substantially be reduced, and electromagnetic compatibility requirements regarding the acquisition of magnetic resonance signals can easier be fulfilled.

Another advantage of the light data communication link device is that because it is based on diffuse light, elaborate and time-consuming adjustment procedures and checks for maintaining a communication by a ray of light can be avoided.

In a preferred embodiment, the light diffuser and the converging lens of the first light emitter and receiver unit and the light diffuser and the converging lens of the second light emitter and receiver unit are configured to be arranged inside the volume. In this way, the distance in space between the light diffuser of the first light emitter and receiver unit and the converging lens of the second light emitter and receiver unit and the distance in space between the light diffuser of the second light emitter and receiver unit and the converging lens of the first light emitter and receiver unit can be kept small relative to other solutions, and the signal-to-noise ratio can be improved.

In one embodiment, the light diffuser and the converging lens of the first light emitter and receiver unit are configured to be integrated in an illumination unit provided for illuminating an examination space of the magnetic resonance examination system. By that, a compact solution can be provided, and at least some of the preparations and holding means for holding the light diffuser and the converging lens of the first light emitter and receiver unit can be saved.

In one embodiment, the light generating member of the first light emitter and receiver unit and the light generating member of the second light emitter and receiver unit generate light of substantially the same wavelength. The phrase "substantially the same wavelength", as used in this application, shall particularly be understood such that the two wavelengths have a relative difference in wavelength ($\Delta\lambda/\lambda$) of less than or equal to 1%. In another embodiment, the light generated by the generating member of the first light emitter and receiver unit has a wavelength that is substantially different from the light generated by the generating member of the second light emitter and receiver unit. The phrase "substantially different wavelength", as used in this application, shall particularly be understood such that the two wavelengths have a relative difference in wavelength ($\Delta\lambda/\lambda$) of more than 1%.

In a preferred embodiment of the light data communication link device, at least one out of
  light traveling through the distance in space between the light diffuser of the first light emitter and receiver unit and the converging lens of the second light emitter and receiver unit, and
  light traveling through the distance in space between the light diffuser of the second light emitter and receiver unit and the converging lens of the first light emitter and receiver unit undergoes at least one reflection.

As the data communication link is based on diffuse light, it is not affected by the at least one reflection, which may be specular or diffuse, for instance at a ceiling or a room wall. At the same time, the data communication link has the advantage of not requiring a direct line of sight. Therefore, the at least one reflection to be of specular nature is not required but does not affect the data communication link either.

In another preferred embodiment, at least one out of the first optical waveguide and the second optical waveguide of the first light emitter and receiver unit or the second light emitter and receiver unit is designed as an optical fiber. In this way, a light generating member or a light receiving member of the light emitter and receiver units can readily be arranged at a location that is remote from the outer boundary surface to avoid radio frequency interference.

Preferably, at least one out of the light generating member of the first light emitter and receiver unit and the light generating member of the second light emitter and receiver unit is designed as a semiconductor laser device. By exploiting the high light intensity of the semiconductor laser device, the signal-to-noise ratio at the receiving side of the optical pathways can be enhanced and/or the range of the light data communication link can be extended.

In yet another preferred embodiment, the first optical waveguide and the second optical waveguide of the first light emitter and receiver unit are designed as optical fibers, and wherein the light generating member and the light receiving member of the first light emitter and receiver unit are arranged at locations remote from the outer boundary surface, and the light diffuser and the converging lens of the first light emitter and receiver unit are arranged in close proximity to the outer boundary surface or inside the volume.

In this way, components of the first light emitter and receiver unit that generate potentially interfering radio frequency signals can readily be arranged at locations that are remote from the outer boundary surface to avoid radio frequency interference, while a length of the first optical pathway and the length of the second optical pathway can at the same time be kept small, which is beneficial for the signal-to-noise ratio of the data communication.

In a preferred embodiment, at least one out of the light diffuser of the first light emitter and receiver unit and the light diffuser of the second light emitter and receiver unit comprises a fluorescent material that is configured for being activated by light traveling along the respective optical pathway. In this way, an enhanced intensity of light can be emanated by the light diffuser, and an improved signal-to-noise ratio and/or an extended range for the data communication can be accomplished.

In one preferred embodiment, the light data communication link device further comprises a data and control interface that is connectable to a control unit of the magnetic resonance examination system for transferring data received via the second optical pathway to the control unit, and for transferring at least one out of control data or control signals from the control unit for controlling light generation by the light generating member of the first light emitter and receiver unit.

In this way, the light data communication link device can provide a bi-directional communication link from and to the control unit of the magnetic resonance examination system which can readily be controlled by the control unit.

In another aspect of the invention, a magnetic resonance examination system configured for acquiring magnetic resonance signals from at least a portion of a subject of interest is provided.

The magnetic resonance examination system comprises
  an examination space provided to arrange at least the portion of the subject of interest within at least during examination,
  a main magnet provided for generating a static magnetic field $B_0$ at least in the examination space,
  at least one radio frequency antenna device that is configured for receiving magnetic resonance signals from the nuclei of or within the portion of the subject of interest that have been excited by applying the radio frequency excitation field $B_1$,
  a control unit configured at least for controlling functions of the magnetic resonance examination system, and
  a signal processing unit configured for processing the acquired magnetic resonance signals.

The magnetic resonance examination system further includes an embodiment of the light data communication link device which comprises a data and control interface, wherein at least the light generating member of the first light emitter and receiver unit is arranged outside the volume, the second light emitter and receiver unit is arranged inside the volume and the data and control interface is connected to the control unit.

Then, the magnetic resonance examination system further comprises at least one auxiliary electronic device having at least one electrical input port and one electrical output port and being arranged inside the volume.

The electrical input port of the light generating member of the second light emitter and receiver unit is connected to the at least one electrical output port of the at least one auxiliary electronic device. The electrical output port of the light receiving member of the second light emitter and receiver unit is connected to the at least one electrical input port of the at least one auxiliary electronic device. By that, a bi-directional data communication link is established between the control unit of the magnetic resonance examination system and the at least one auxiliary electronic device. The bi-directional data communication link can enable a control of functions of the at least one auxiliary electronic device by sending control data or control signals from the control unit to the at least one auxiliary electronic device. The bi-directional data communication link can further enable a transmission of data, which may be generated and/or acquired by the at least one auxiliary electronic device, to the control unit. The bi-directional data communication can be carried out with a reduced level of potentially interfering radio frequency signals.

In a preferred embodiment of the magnetic resonance examination system, the at least one auxiliary electronic device includes at least one analog-to-digital converter having at least one input port and at least one output port, and a de-tuning circuit controller having at least one input port and at least one output port.

The at least one radio frequency antenna device is electrically or magnetically coupled to the at least one input port of the analog-to-digital converter, and the at least one output port of the analog-to-digital converter is electrically connected to the input port of the light generating member of the second light emitter and receiver unit.

The at least one radio frequency antenna device is electrically or magnetically coupled to the at least one output port of the de-tuning circuit controller, whose at least one input port in turn is electrically or optically connected to the output port of the light receiving member of the second light emitter and receiver unit.

The first optical pathway is configured to transmit data that serve as a basis for tuning the at least one radio frequency antenna device into or out of a state of being resonant to the Larmor frequency of the excited nuclei.

The second optical pathway is configured to transmit data that represent the magnetic resonance signals acquired by the at least one radio frequency antenna device via the control unit to the signal processing unit.

In this way, control of a tuning state of and transmission of magnetic resonance signals received by the at least one radio frequency antenna device via the control unit can be enabled by the light data communication link device, with a reduced level of potentially interfering radio frequency signals.

It is another aspect of the invention to provide a method of using an embodiment of the light data communication link device having a data and control interface in an embodiment of the magnetic resonance examination system as disclosed herein.

The method comprises steps of
providing electrical output signals generated by the at least one auxiliary electronic device at the at least one electrical output port to the electrical input port of the light generating member of the second light emitter and receiver unit,
generating optical output signals by the light generating member of the second light emitter and receiver unit based on the provided electrical output signals,
transmitting the optical output signals along the second optical pathway to the light receiving member of the first light emitter and receiver unit,
generating electrical output signals by the light receiving member of the first light emitter and receiver unit based on the transmitted optical output signals,
transferring the electrical output signals via the data and control interface to the control unit.

By carrying out the method, the advantages of the light data communication link device already described herein can be accomplished.

Another method of using the embodiment of the light data communication link device having a data and control interface in the embodiment of the magnetic resonance examination system as disclosed herein that can be carried out alternatively or in addition to the previous method, wherein steps or sets of steps of the two methods may be carried out subsequently in an alternate way and some steps of the two methods may be carried out simultaneously, comprises steps of
providing control signals by the control unit,
transferring the control signals via the data and control interface to the electrical input port of the light generating member of the first light emitter and receiver unit,
generating optical output signals by the light generating member of the first light emitter and receiver unit based on the provided control signals,
transmitting the optical output signals along the first optical pathway to the light receiving member of the second light emitter and receiver unit,
generating electrical output signals by the light receiving member of the second light emitter and receiver unit at the electrical output port based on the transmitted optical output signals,
providing the electrical output signals generated by the light receiving member of the second light emitter and receiver unit to the at least one electrical input port of the at least one auxiliary electronic device.

By carrying out the method, the additional advantages of the light data communication link device already described herein can be accomplished.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
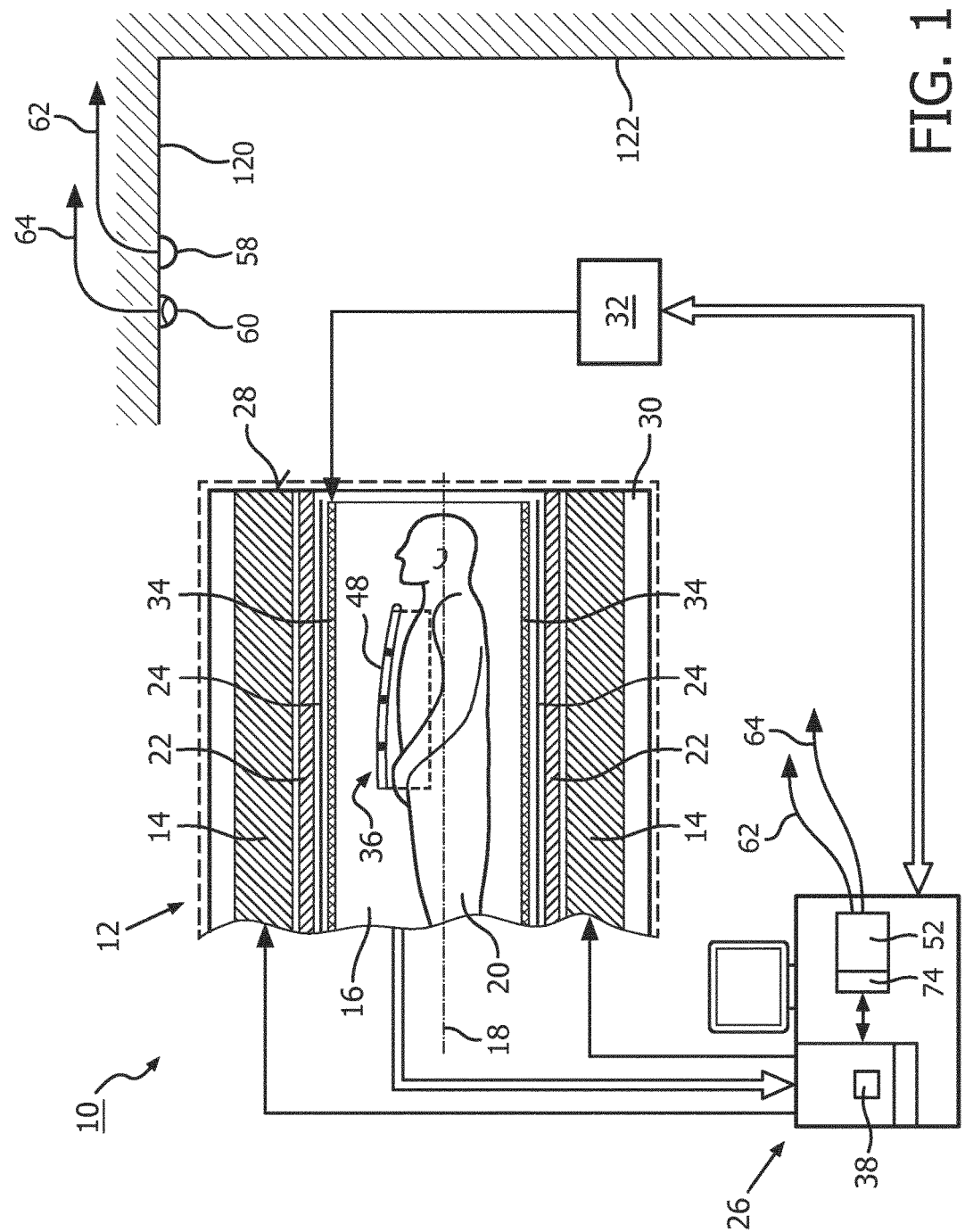
FIG. 1 shows a schematic illustration of a part of an embodiment of a magnetic resonance imaging system having a light data communication link device in accordance with the invention, FIG. 2 schematically illustrates the light data communication link device pursuant to FIG. 1.

FIG. 1 shows a schematic illustration of a part of an embodiment of a magnetic resonance examination system 10 in accordance with the invention that is configured for acquiring magnetic resonance signals from at least a portion of a subject of interest 20. The magnetic resonance examination system 10 is designed, without limitation for the scope of protection, as a magnetic resonance imaging system, and the subject of interest 20 usually is a patient. A light data communication link device as described for use in this specific embodiment of the magnetic resonance examination system can also be used in other embodiments of a magnetic resonance examination system, for instance a magnetic resonance spectroscopy system, as will readily be appreciated by those skilled in the art.

The magnetic resonance examination system 10 comprises a scanning unit 12 with a main magnet 14 provided for generating a static magnetic field $B_0$. The main magnet 14 has a central bore that provides an examination space 16 around a center axis 18 for the subject of interest 20 to be arranged within at least during examination. The static magnetic field $B_0$ is generated by the main magnet 14 at least in the examination space 16. The static magnetic field $B_0$ defines an axial direction of the examination space 16, aligned in parallel to the center axis 18.

The scanning unit 12 comprises an enclosure having an outer enclosure surface 28 which is defined by maximum spatial dimensions of the scanning unit 12. In practice the outer enclosure is formed by the covers of the magnet of the magnetic resonance examination system.

The magnetic resonance imaging system further comprises a magnetic gradient coil system 22 with magnetic gradient coils provided for generating gradient magnetic fields superimposed to the static magnetic field $B_0$. The magnetic gradient coils are concentrically arranged within the bore of the main magnet 14, as is known in the art.

Further, the magnetic resonance imaging system includes a radio frequency antenna device 34 designed as a whole-body coil that is provided for applying a radio frequency magnetic field $B_1$ to nuclei of or within the subject of interest 20 during radio frequency transmit phases to excite the nuclei of or within the portion the subject of interest 20. To this end, radio frequency power is fed, controlled by a control unit 26, from a radio frequency transmitter 32 to the whole-body coil. The whole-body coil has a center axis and, in the operational state, is arranged concentrically within the bore of the main magnet 14 such that the center axis of the whole-body coil and the center axis 18 of the scanning unit 12 coincide. As is well known in the art, a cylindrical metal radio frequency shield 24 is arranged concentrically between the magnetic gradient coil system 22 and the whole-body coil. The control unit 26 is provided at least for controlling functions of the magnetic resonance imaging system.

Moreover, the magnetic resonance imaging system comprises a plurality of radio frequency antenna devices 36 provided for receiving magnetic resonance signals from the nuclei of or within the subject of interest 20 that have been excited by applying the radio frequency excitation field $B_1$. The radio frequency antenna devices 36 of the plurality of radio frequency antenna devices 36 are designed as an array of local coils that are intended to be positioned proximal to a region of the subject of interest 20 to be imaged, which in this specific embodiment is the heart. The local coils are configured for receiving magnetic resonance signals from the excited nuclei of or within the portion of the subject of interest 20 to be imaged during radio frequency receiving time periods which are distinct from the radio frequency transmit time periods.

Furthermore, the magnetic resonance examination system 10 comprises a signal processing unit 38 configured for processing the acquired magnetic resonance signals to determine magnetic resonance images of at least the portion of the subject of interest 20.

Figure 2:
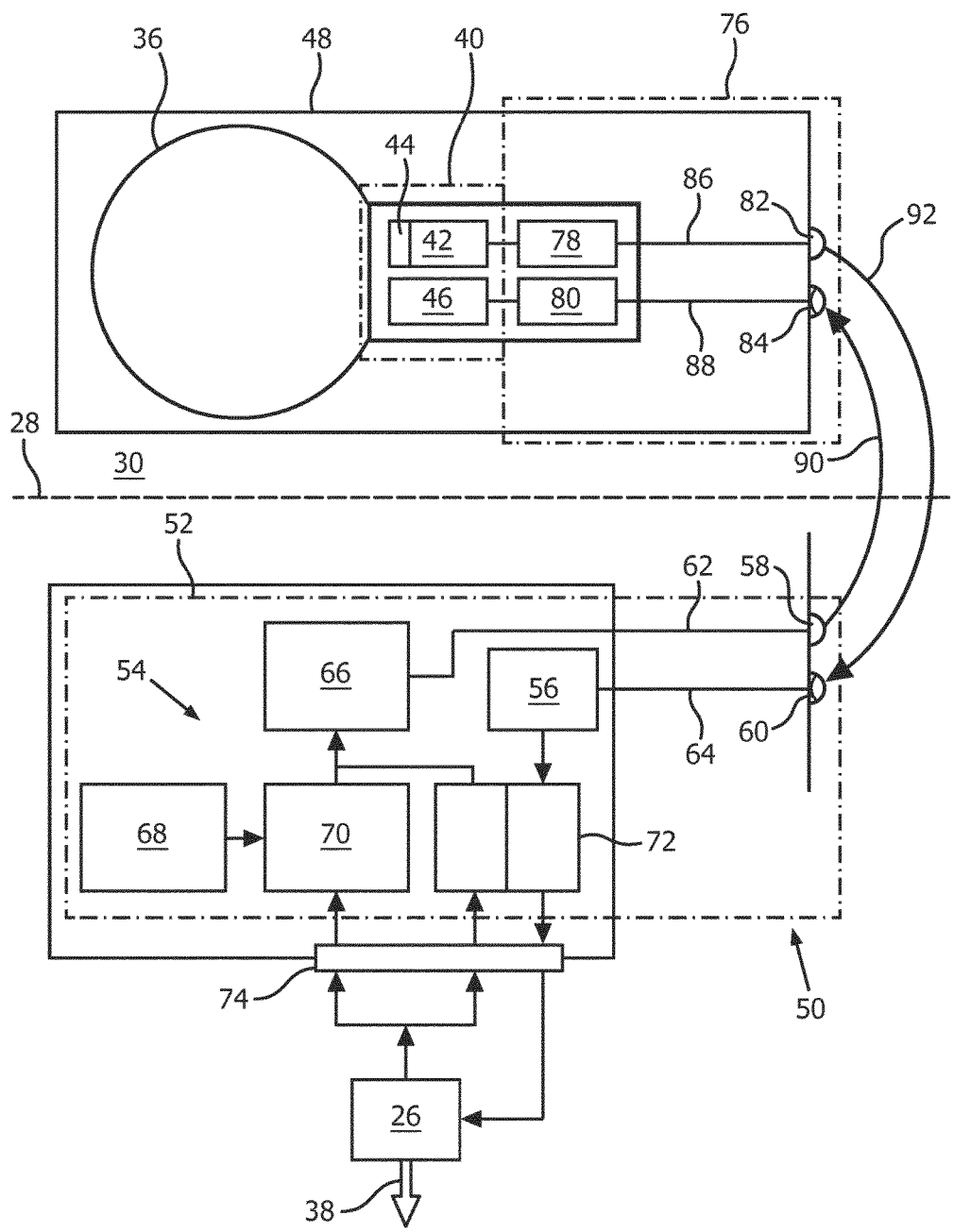

As is known in the art, the local coils have to be resonant to the Larmor frequency of the radio frequency magnetic field $B_1$ during radio frequency receiving time periods, but must not be resonant to the Larmor frequency during radio frequency transmit time periods to prevent damage. For the purpose of tuning the local coils into or out of a state of being resonant to the Larmor frequency of the excited nuclei, the magnetic resonance imaging system includes an auxiliary electronic device 40 (FIG. 2).

The auxiliary electronic device 40 includes an analog-to-digital converter 42, an electronic multiplexer 44 and a de-tuning circuit controller 46. In a state of operation, the auxiliary electronic device 40 is arranged in close proximity to the array of local coils. This is accomplished by arranging the array of local coils and the auxiliary electronic device 40 in a common radio frequency coil housing 48. The radio frequency coil housing 48 is disposed within a volume 30 that has an outer boundary surface that comprises the outer enclosure surface 28 of the scanning unit 12.

The analog-to-digital converter 42 has an input port and an output port. Each local coil of the array of local coils is magnetically coupled to one pickup loop out of a plurality of pickup loops (not shown), which in turn is electrically connected to input ports of the electronic multiplexer 44. For reasons of clarity, only one local coil is exemplarily shown in FIG. 2. The electronic multiplexer 44 is configured to subsequently connect the pickup loops to the input port of the analog-to-digital converter 42.

The de-tuning circuit controller 46 comprises an input port and a plurality of output ports. Each output port of the plurality of output ports is connected to a de-tuning circuit that is capacitively coupled to one local coil of the array of local coils. By activating the output port that is connected to a specific local coil, the local coil can be tuned into a state of being resonant to the Larmor frequency. Such de-tuning circuits are well known in the art and shall therefore not be described in more detail herein.

For the purpose of transferring data from the output port of the analog-to-digital converter 42 that represent magnetic resonance signals acquired by the array of local coils, to the signal processing unit 38, and for the purpose of transferring control data from the control unit 26 to the de-tuning circuit controller 46, the magnetic resonance imaging system includes a light data communication link device 50.

The light data communication link device 50 comprises a first light emitter and receiver unit 52, a second light emitter and receiver unit 76 and a data and control interface 74 that is connected to the control unit 26 of the magnetic resonance imaging system.

Each light emitter and receiver unit 52, 76 includes a light generating member 54, 78 that is configured to generate light depending on an electrical signal applied to an electrical input port of the light generating member 54, 78, a light receiving member 56, 80 that is configured to generate an electrical signal at an electrical output port as a function of received light, a light diffuser 58, 82 and a converging lens 60 84.

In each light emitter and receiver unit 52, 76, the light generating member 54, 78 is optically connected to the light diffuser 58, 82 by a first optical waveguide 62, 86, and the light receiving member 56, 80 is optically connected to the converging lens 60, 84 by a second optical waveguide 64, 88 of the respective light emitter and receiver unit 52, 76. The first optical waveguides 62, 86 and the second optical waveguides 64, 88 are designed as optical fibers.

The light diffusers 58, 82 are designed as hollow semi-spheres made from translucent plastic material whose inner surface comprises a coating of fluorescent material, which will be activated by incident light generated by the respective light generating member 54, 78.

The light generating member 54 of the first light emitter and receiver unit 52 is designed as a semiconductor laser device comprising a laser diode 66, a power supply 68, a light intensity control unit 70 and a data modulator/demodulator unit 72.

The light generating member 54 and the light receiving member 56 of the first light emitter and receiver unit 52 are arranged inside a radio frequency shielded housing that is located inside the control unit 26 of the magnetic resonance imaging system (FIG. 1) and thus remote from and outside the outer boundary surface of the volume 30, whereas the light diffuser 58 and the converging lens 60 of the first light emitter and receiver unit 52 are arranged at the ceiling 120 of the room in which the magnetic resonance imaging system is installed.

The light generating member 78 and the light receiving member 80 of the second light emitter and receiver unit 76 are arranged inside the radio frequency coil housing 48. The light diffuser 82 and the converging lens 84 are disposed at an outer surface of the radio frequency coil housing 48 (FIG. 2).

The output port of the analog-to-digital converter 42 is electrically connected to the input port of the light generating member 78 of the second light emitter and receiver unit 76.

The input port of the de-tuning circuit controller 46 is electrically connected to the output port of the light receiving member 80 of the second light emitter and receiver unit 76.

In this way, the light generating member 54, the first optical waveguide 62 and the light diffuser 58 of the first light emitter and receiver unit 52, a distance in space between the light diffuser 58 of the first light emitter and receiver unit 52 and the converging lens 84 of the second light emitter and receiver unit 76, and the converging lens 84, the second optical waveguide 88 and the light receiving member 80 of the second light emitter and receiver unit 76 form a first optical pathway 90 for transmitting data from the control unit 26 to the de-tuning circuit controller 46 of the auxiliary electronic device 40, for tuning the local coils of the plurality of local coils into or out of a state of being resonant to a Larmor frequency of the excited nuclei.

Further, the light generating member 78, the first optical waveguide 86 and the light diffuser 82 of the second light emitter and receiver unit 76, a distance in space between the light diffuser 82 of the second light emitter and receiver unit 76 and the converging lens 60 of the first light emitter and receiver unit 52, and the converging lens 60, the second optical waveguide 64 and the light receiving member 56 of the first light emitter and receiver unit 52 form a second optical pathway 92 for transmitting data that represent the magnetic resonance signals acquired by the plurality of local coils from the analog-to-digital converter 42 via the control unit 26 to the signal processing unit 38. That is, the optical pathway extend between the magnetic resonance examination system's magnet and the signal processing unit that incorporates the reconstructor that is located remotely from the magnet.

Figure 3:
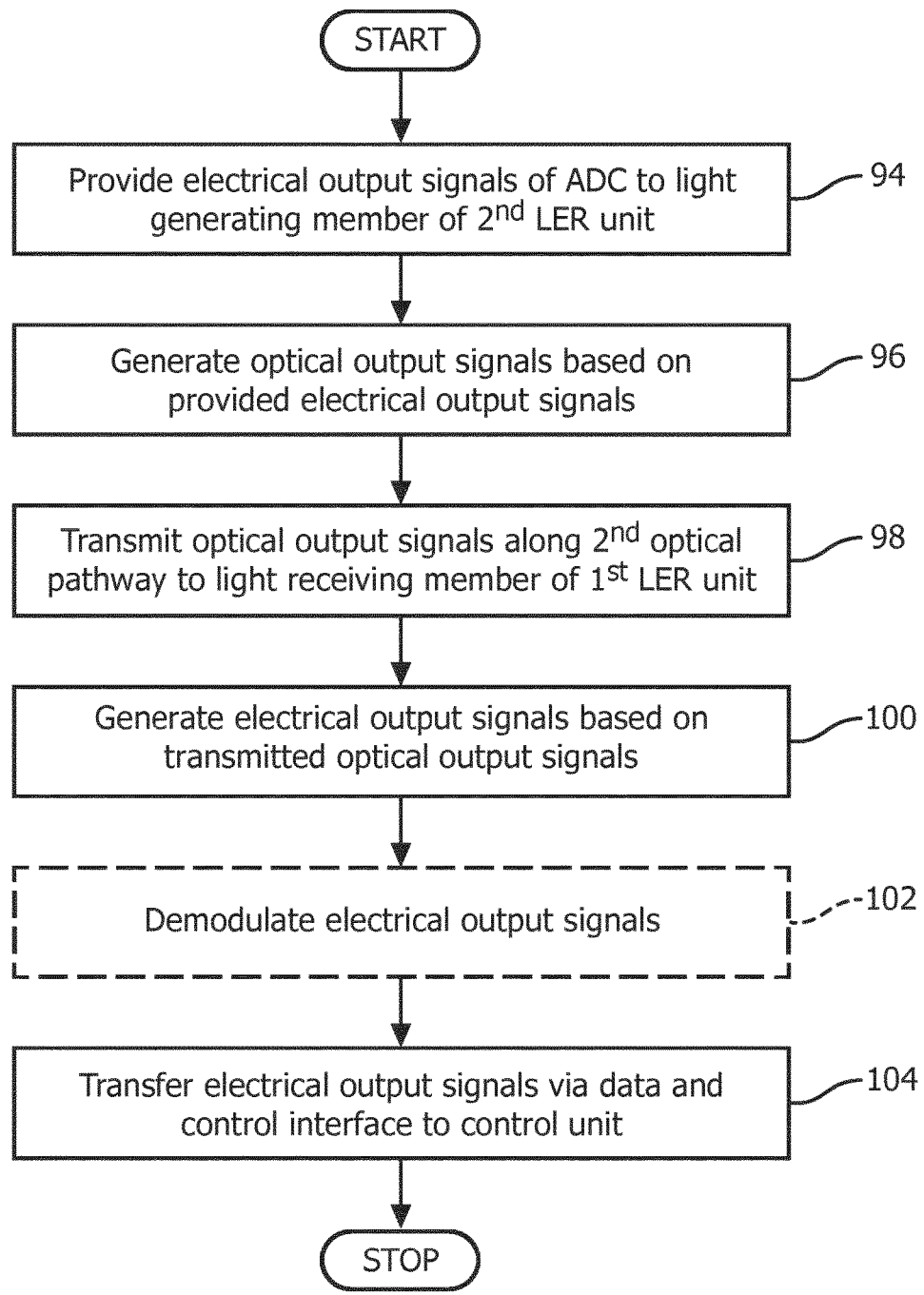
FIG. 3 is a flowchart of an embodiment of a method for using the light data communication link device pursuant to FIG. 1.

In the following, an embodiment of a method of using the light data communication link device 50 in the magnetic resonance imaging system during radio frequency receiving time periods will be described. A flowchart of the method is given in FIG. 3. In preparation of using the light data communication link device 50, it shall be understood that all involved units and devices are in an operational state and configured as illustrated in FIGS. 1 and 2.

In one step 94 of the method, electrical output signals generated by the auxiliary electronic device 40 at the electrical output port of the analog-to-digital converter 42 are provided to the electrical input port of the light generating member 78 of the second light emitter and receiver (LER) unit 76.

In another step 96, optical output signals are generated by the light generating member 78 of the second light emitter and receiver unit 76 based on the provided electrical output signals.

In a following step 98, the optical output signals are transmitted along the second optical pathway 92 to the light receiving member 56 of the first light emitter and receiver unit 52. The light traveling through the distance in space between the light diffuser 82 of the second light emitter and receiver unit 76 and the converging lens 60 of the first light emitter and receiver unit 52 undergoes at least one reflection at the room wall 122.

In the next step 100, electrical output signals are generated by the light receiving member 56 of the first light emitter and receiver unit 52 based on the transmitted optical output signals.

As an optional step 102, the electrical output signals are demodulated by an optional modulator/demodulator unit 72.

Then, in another step 104, the electrical output signals are transferred via the data and control interface 74 to the control unit 26 and, further, to the signal processing unit 38.

Figure 4:
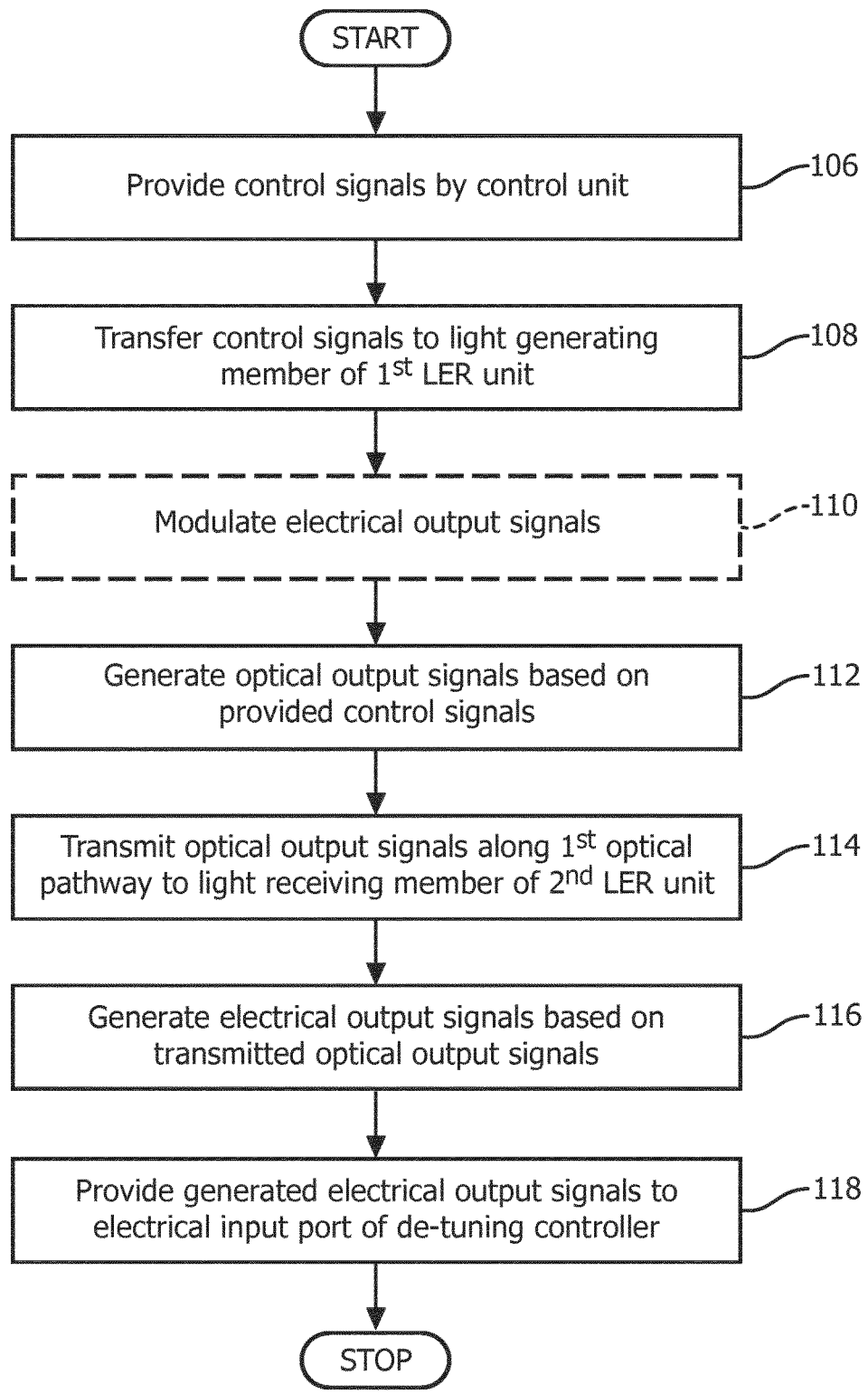
FIG. 4 is a flowchart of another embodiment of a method for using the light data communication link device pursuant to FIG. 1.

Next, an embodiment of a method of using the light data communication link device 50 in the magnetic resonance imaging system during radio frequency transmit time periods will be described. A flowchart of the method is given in FIG. 4. Again, in preparation of using the light data communication link device 50, it shall be understood that all involved units and devices are in an operational state and configured as illustrated in FIGS. 1 and 2.

In one step of the method 106, control signals are provided by the control unit 26.

In another step 108, the control signals are transferred via the data and control interface 74 to the electrical input port of the light generating member 54 of the first light emitter and receiver unit 52. In an optional step 110, the control signals may be modulated by an optional modulator/demodulator unit 72.

In a following step 112, optical output signals are generated by the light generating member 54 of the first light emitter and receiver unit 52 based on the provided control signals.

In a next step 114, the optical output signals are transmitted along the first optical pathway 90 to the light receiving member 80 of the second light emitter and receiver unit 76. The light traveling through the distance in space between the light diffuser 58 of the first light emitter and receiver unit 52 and the converging lens 84 of the second light emitter and receiver unit 76 undergoes at least one reflection at the room wall 122.

In another step 116, electrical output signals are generated by the light receiving member 80 of the second light emitter and receiver unit 76 at the electrical output port, based on the transmitted optical output signals.

Then, in a next step 118, the electrical output signals generated by the light receiving member 80 of the second light emitter and receiver unit 76 are provided to the electrical input port of the de-tuning circuit controller 46 of the auxiliary electronic device 40.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

| REFERENCE SYMBOL LIST | |
|---|---|
| 10 | magnetic resonance examination system |
| 12 | scanning unit |
| 14 | main magnet |
| 16 | examination space |
| 18 | center axis |
| 20 | subject of interest |
| 22 | magnetic gradient coil system |
| 24 | RF shield |
| 26 | control unit |
| 28 | outer enclosure surface |
| 30 | volume |
| 32 | RF transmitter |
| 34 | RF antenna device (transmit) |
| 36 | RF antenna device (receive) |
| 38 | signal processing unit |
| 40 | auxiliary electronic device |
| 42 | analog-to-digital converter |
| 44 | multiplexer |
| 46 | de-tuning circuit controller |
| 48 | radio frequency coil housing |
| 50 | light data communication link device |
| 52 | first light emitter and receiver unit |
| 54 | light generating member |
| 56 | light receiving member |
| 58 | light diffuser |
| 60 | converging lens |
| 62 | first optical waveguide |
| 64 | second optical waveguide |
| 66 | laser diode |
| 68 | power supply |
| 70 | light intensity control unit |
| 72 | modulator/demodulator unit |
| 74 | data and control interface |
| 76 | second light emitter and receiver unit |
| 78 | light generating member |
| 80 | light receiving member |
| 82 | light diffuser |
| 84 | converging lens |
| 86 | first optical waveguide |
| 88 | second optical waveguide |
| 90 | first optical pathway |
| 92 | second optical pathway |
| | Method steps |

| REFERENCE SYMBOL LIST -continued | |
|---|---|
| 94 | provide electrical output signals to light generating member |
| 96 | generate optical output signals based on provided electrical signals |
| 98 | transmit optical output signals along $2^{nd}$ optical pathway |
| 100 | generate electrical output signals based on transmitted optical signals |
| 102 | demodulate electrical output signals |
| 104 | transfer electrical output signals to control unit and processing unit |
| 106 | provide control signals |
| 108 | transfer control signals to light generating member |
| 110 | modulate control signals |
| 112 | generate optical output signals based on control signals |
| 114 | transmit optical output signals along $1^{st}$ optical pathway |
| 116 | generate electrical output signals based on optical output signals |
| 118 | provide electrical output signals to de-tuning circuit controller |
| 120 | ceiling |
| 122 | room wall |

The invention claimed is:

1. A light data communication link device for use in a magnetic resonance examination system including a scanning unit that comprises an enclosure having an outer enclosure surface defined by maximum spatial dimensions of the scanning unit, the light data communication link device comprising:
   a first light emitter and receiver unit and a second light emitter and receiver unit, each of the first and second light emitter and receiver units comprising:
   a light generating member that is configured to generate light depending on an electrical signal applied to an electrical input port of the light generating member;
   a light receiving member that is configured to generate an electrical signal at an electrical output port as a function of received light;
   a light diffuser comprising a hollow semi-sphere;
   a converging lens, wherein, in each of the first and second light emitter and receiver units, the light generating member is optically connected to the light diffuser by a first optical waveguide, and the light receiving member is optically connected to the converging lens by a second optical waveguide of the respective first and second light emitter and receiver units;
   a first optical pathway for data communication existing along first distance between the light diffuser of the first light emitter and receiver unit and the converging lens of the second light emitter and receiver unit, and the converging lens, the second optical waveguide and the light receiving member of the second light emitter and receiver unit; and
   a second optical pathway existing along a second distance between the light diffuser of the second light emitter and receiver unit and the converging lens of the first light emitter and receiver unit, and the converging lens, the second optical waveguide, and the light receiving member of the first light emitter and receiver unit, wherein at least the light generating member of the first light emitter and receiver unit is configured to be arranged outside a volume having an outer boundary surface comprising the outer enclosure surface, and the second light emitter and receiver unit is configured to be at least partially arranged inside the volume.

2. The light data communication link device as claimed in claim 1, wherein the light diffuser and the converging lens of the first light emitter and receiver unit and the light diffuser and the converging lens of the second light emitter and receiver unit are configured to be arranged inside the volume.

3. The light data communication link device as claimed in claim 1, wherein at least one out of
light traveling through the first distance in space between the light diffuser of the first light emitter and receiver unit and the converging lens of the second light emitter and receiver unit, and
light traveling through the second distance in space between the light diffuser of the second light emitter and receiver unit and the converging lens of the first light emitter and receiver unit undergoes at least one reflection.

4. The light data communication link device as claimed in claim 1, wherein at least one out of the first optical waveguide and the second optical waveguide of the first light emitter and receiver unit or the second light emitter and receiver unit is designed as an optical fiber.

5. The light data communication link device as claimed in claim 1, wherein at least one out of the light generating member of the first light emitter and receiver unit and the light generating member of the second light emitter and receiver unit comprises a semiconductor laser device.

6. The magnetic resonance examination system as claimed in claim 5, wherein the semiconductor laser device comprises a laser diode.

7. The magnetic resonance examination system as claimed in claim 6, wherein the first light emitter and receiver unit further comprises a power supply, and a light intensity controller.

8. The magnetic resonance examination system as claimed in claim 6, wherein the second light emitter and receiver unit further comprises a power supply and a light intensity controller.

9. The light data communication link device as claimed in claim 1, wherein the first optical waveguide and the second optical waveguide of the first light emitter and receiver unit are designed as optical fibers, and wherein the light generating member and the light receiving member of the first light emitter and receiver unit are arranged at locations remote from the outer boundary surface, and the light diffuser and the converging lens of the first light emitter and receiver unit are arranged in close proximity to the outer boundary surface or inside the volume.

10. The light data communication link device as claimed in claim 1, wherein at least one out of the light diffuser of the first light emitter and receiver unit and the light diffuser of the second light emitter and receiver unit comprises a fluorescent material that is configured for being activated by light traveling along the first optical pathway or the second optical pathway.

11. The light data communication link device as claimed in claim 1, further comprising a data and control interface that is connectable to a controller of the magnetic resonance examination system for transferring data received via the second optical pathway by the controller, and for transferring at least one out of control data or control signals from the controller for controlling light generation by the light generating member of the first light emitter and receiver unit.

12. A magnetic resonance examination system configured for acquiring magnetic resonance signals from at least a portion of a subject of interest, comprising:
an examination space provided to arrange at least the portion of the subject of interest within at least during examination,
a main magnet provided for generating a static magnetic field $B_0$ at least in the examination space,
at least one radio frequency antenna device that is configured for receiving magnetic resonance signals from nuclei of or within the portion of the subject of interest that have been excited by applying a radio frequency excitation field $B_1$,
a controller configured at least for controlling functions of the magnetic resonance examination system,
a signal processing unit configured for processing the acquired magnetic resonance signals,
a light data communication link device as claimed in claim 8, wherein at least the light generating member of the first light emitter and receiver unit is arranged outside the volume, the second light emitter and receiver unit is at least partially arranged inside the volume and the data and control interface is connected to the controller, and
at least one auxiliary electronic device, having at least one electrical input port and at least one electrical output port and being arranged inside the volume, and
wherein
the electrical input port of the light generating member of the second light emitter and receiver unit is connected to the at least one electrical output port of the at least one auxiliary electronic device, and
the electrical output port of the light receiving member of the second light emitter and receiver unit is connected to the at least one electrical input port of the at least one auxiliary electronic device
to establish a bi-directional data communication link between a controller of the magnetic resonance examination system and the at least one auxiliary electronic device.

13. The magnetic resonance examination system as claimed in claim 12, wherein
the at least one auxiliary electronic device includes at least one analog-to-digital converter having at least one input port and at least one output port, and a de-tuning circuit controller having at least one input port and at least one output port, wherein
the at least one radio frequency antenna device is electrically or magnetically coupled to the at least one input port of the analog-to-digital converter, and the at least one output port of the analog-to-digital converter is electrically connected to the input port of the light generating member of the second light emitter and receiver unit, and
the at least one radio frequency antenna device is electrically or magnetically coupled to the at least one output port of the de-tuning circuit controller, whose at least one input port in turn is electrically or optically connected to the output port of the light receiving member of the second light emitter and receiver unit, wherein
the first optical pathway is configured to transmit data that serve as a basis for tuning the at least one radio frequency antenna device into or out of a state of being resonant to a Larmor frequency of excited nuclei, and
the second optical pathway is configured to transmit data that represent the magnetic resonance signals acquired by the at least one radio frequency antenna device via the controller to the signal processing unit.

14. A method of using the light data communication link device as claimed in claim 11, in a magnetic resonance examination system, the method comprising:
providing electrical output signals generated by the at least one auxiliary electronic device at the at least one electrical output port to the electrical input port of the light generating member of the second light emitter and receiver unit,
generating optical output signals by the light generating member of the second light emitter and receiver unit based on the provided electrical output signals,
transmitting the optical output signals along the second optical pathway to the light receiving member of the first light emitter and receiver unit,
generating electrical output signals by the light receiving member of the first light emitter and receiver unit based on the transmitted optical output signals,
transferring the electrical output signals via the data and control interface to the controller.

15. The method of using the light data communication link claimed in claim 14, the method further comprising:
providing control signals by the controller,
transferring the control signals via the data and control interface to the electrical input port of the light generating member of the first light emitter and receiver unit,
generating optical output signals by the light generating member of the first light emitter and receiver unit based on the provided control signals,
transmitting the optical output signals along the first optical pathway to the light receiving member of the second light emitter and receiver unit,
generating electrical output signals by the light receiving member of the second light emitter and receiver unit at the electrical output port based on the transmitted optical output signals,
providing the electrical output signals generated by the light receiving member of the second light emitter and receiver unit to the at least one electrical input port of the at least one auxiliary electronic device.

16. The magnetic resonance examination system as claimed in claim 1, wherein the hollow semi-sphere comprises a translucent plastic material.

17. The magnetic resonance examination system as claimed in claim 1, wherein a portion of the first optical pathway exists in space.

18. The magnetic resonance examination system as claimed in claim 1, wherein a portion of the second optical pathway exists in space.

19. The magnetic resonance examination system as claimed in claim 1, further comprising a coating of fluorescent material disposed translucent plastic material, wherein the coating of fluorescent material is activated by incident light generated by the respective light generating members.

20. The magnetic resonance examination system as claimed in claim 1, wherein the light generating member and the light receiving member of the first light emitter and receiver unit are disposed in a radio frequency shielded housing.

* * * * *